United States Patent
Reitmeier et al.

(10) Patent No.: US 9,574,912 B2
(45) Date of Patent: Feb. 21, 2017

(54) SENSOR ELEMENT

(71) Applicant: Continental Automotive GmbH, Hannover (DE)

(72) Inventors: Willibald Reitmeier, Hohenschambach (DE); Philippe Grass, Regensburg (DE); Johannes Ante, Regensburg (DE)

(73) Assignee: CONTINENTAL AUTOMOTIVE GMBH, Hanover (DE)

(*) Notice: Subject to any disclaimer, the term of this patent is extended or adjusted under 35 U.S.C. 154(b) by 0 days.

(21) Appl. No.: 15/029,683

(22) PCT Filed: Oct. 14, 2014

(86) PCT No.: PCT/EP2014/071951
§ 371 (c)(1),
(2) Date: Apr. 15, 2016

(87) PCT Pub. No.: WO2015/055609
PCT Pub. Date: Apr. 23, 2015

(65) Prior Publication Data
US 2016/0231146 A1    Aug. 11, 2016

(30) Foreign Application Priority Data

Oct. 15, 2013  (DE) .................... 10 2013 220 908

(51) Int. Cl.
*G01D 11/24* (2006.01)
*G01N 27/00* (2006.01)
*B81B 7/00* (2006.01)

(52) U.S. Cl.
CPC ........... *G01D 11/245* (2013.01); *B81B 7/0077* (2013.01)

(58) Field of Classification Search
CPC ............................ G01N 27/00; G01N 27/128
See application file for complete search history.

(56) References Cited

U.S. PATENT DOCUMENTS

| 7,966,877 B2 | 6/2011 | Renninger et al. ......... 73/204.26 |
| 8,404,516 B2 | 3/2013 | Bauer et al. .................. 438/108 |

(Continued)

FOREIGN PATENT DOCUMENTS

| DE | 1157483 A | * 7/1969 | ........... H05B 1/0208 |
| DE | 10247857 A1 | * 4/2004 | ........... G01N 27/128 |

(Continued)

OTHER PUBLICATIONS

German Office Action, Application No. 102013220908.8, 9 pages, Oct. 1, 2014.

(Continued)

*Primary Examiner* — Lisa Caputo
*Assistant Examiner* — Jamel Williams
(74) *Attorney, Agent, or Firm* — Slayden Grubert Beard PLLC

(57) ABSTRACT

A sensor element may include a measuring element and a functional housing at least partially surrounding the measuring element including a plastic molded housing. The measuring element may include a hot plate mounted on a carrier substrate by means of narrow arms in a broadly thermally decoupled manner. The carrier substrate may be provided with contacts leading to the measuring element and terminating in contact/bonding points on the carrier substrate. The carrier substrate together with the contact/bonding points may be at least partially integrated into the plastic molded housing, leaving the hot plate exposed. The housing may include connection wiring for the contact/bonding points.

7 Claims, 1 Drawing Sheet

(56) References Cited

U.S. PATENT DOCUMENTS

| | | | |
|---|---|---|---|
| 8,692,119 B2 | 4/2014 | Riebel et al. | 174/126.4 |
| 9,212,938 B2 | 12/2015 | Etherington et al. | |
| 9,279,709 B2 | 3/2016 | Etherington et al. | |
| 2004/0195096 A1* | 10/2004 | Tsamis | B81C 1/00682 |
| | | | 204/426 |
| 2009/0107980 A1* | 4/2009 | Andel | A61M 16/1075 |
| | | | 219/443.1 |
| 2009/0168838 A1 | 7/2009 | Harr et al. | 374/163 |
| 2009/0312954 A1* | 12/2009 | Utriainen | G01N 27/128 |
| | | | 702/23 |
| 2010/0233824 A1 | 9/2010 | Verhoeckx et al. | 436/501 |
| 2011/0313252 A1 | 12/2011 | Lin | 600/162 |
| 2012/0034573 A1 | 2/2012 | Erdmann et al. | 433/29 |
| 2012/0043131 A1 | 2/2012 | Christov et al. | 174/521 |
| 2012/0161796 A1 | 6/2012 | Smith et al. | 324/693 |
| 2012/0248636 A1* | 10/2012 | Fridberg | A61M 16/1075 |
| | | | 261/128 |
| 2015/0287674 A1* | 10/2015 | Schrank | H01L 24/94 |
| | | | 257/414 |
| 2016/0195483 A1* | 7/2016 | Reitmeier | G01N 25/32 |
| | | | 422/83 |

FOREIGN PATENT DOCUMENTS

| | | | | |
|---|---|---|---|---|
| DE | 102005016449 A1 | | 10/2006 | B81B 1/00 |
| DE | 102007025992 A1 | * | 12/2008 | B81B 7/0058 |
| DE | 102009008457 A1 | | 8/2010 | B29C 45/14 |
| DE | 102011050895 A1 | | 12/2011 | B81B 7/00 |
| DE | 102010043062 A1 | | 5/2012 | G01F 1/684 |
| DE | 102010043083 A1 | | 5/2012 | G01F 1/684 |
| DE | 102011078992 A1 | | 1/2013 | G01F 1/684 |
| DE | WO 2015028655 A1 | * | 3/2015 | G01N 27/4067 |
| JP | 11030553 A | | 2/1999 | A61B 5/00 |
| JP | 2004179238 A | * | 6/2004 | |
| JP | 2007329008 A | * | 12/2007 | |
| KR | 20030029249 A | * | 4/2003 | H01L 21/67103 |
| WO | 2007/048785 A2 | | 5/2007 | G01N 33/487 |
| WO | 2015/055609 A1 | | 4/2015 | B81B 7/00 |

OTHER PUBLICATIONS

International Search Report and Written Opinion, Application No. PCT/EP2014/071951, 18 pages, Jan. 26, 2015.

* cited by examiner

SENSOR ELEMENT

CROSS-REFERENCE TO RELATED APPLICATIONS

This application is a U.S. National Stage Application of International Application No. PCT/EP2014/071951 filed Oct. 14, 2014, which designates the United States of America, and claims priority to DE Application No. 10 2013 220 908.8 filed Oct. 15, 2013, the contents of which are hereby incorporated by reference in their entirety.

TECHNICAL FIELD

The present disclosure relates to sensor and, specifically discloses sensor elements and housings for those elements.

BACKGROUND

It is known to provide sensor elements with a functional housing made of metal. Such metal housings are used in particular when measuring elements which generate large quantities of heat are present.

Sensor elements are also known in which the measuring element is accommodated in a functional housing that is designed as a plastic molded housing. In these cases the measuring element is molded into a plastic housing. The corresponding components in this case are, for example, encapsulated directly with the plastic compound. Such plastic functional housings are characterized by a high level of resistance to media, a relatively good temperature resistance and a low thermal expansion. But they are not able to accommodate measuring elements which generate large quantities of heat (T>250° C.)

SUMMARY OF THE INVENTION

The present disclosure provides teaching particularly suitable for a measuring element which generates large quantities of heat.

The measuring element may include a hot plate mounted on a carrier substrate by means of narrow arms in a broadly thermally decoupled manner, said carrier substrate being provided with contacts which lead to the measuring element and which terminate in contact/bonding points on the carrier substrate, and that the carrier substrate together with the contact/bonding points is at least partially integrated into the plastic molded housing, leaving the hot plate exposed, said housing containing connection wiring for the contact/bonding points.

A "hot plate" is, for example, a small plate consisting of a suitable ceramic, which is mounted on a carrier substrate surrounding the hot plate by means of two or more narrow arms. Such a hot plate ensures a thermal decoupling of the measuring element, in particular hot measuring element, from the corresponding contact/bonding points on the carrier substrate which are contacted by connection wiring. An example of such a hot plate is described in DE 102 47 857 A1.

Some embodiments of the present teachings include a hot plate with a functional housing for the sensor element that is designed as a plastic molded housing. In these embodiments, the carrier substrate together with the contact/bonding points may be integrated in the plastic molded housing, leaving the hot plate exposed. The contact/bonding points and the associated connection wiring are here accommodated by the plastic molded housing. The carrier substrate with the contact/bonding points and the corresponding connection wiring are therefore molded into the plastic compound of the molded housing. The hot plate is not molded together with the housing here, so that the thermal decoupling of the measuring element (the hot plate) from the carrier substrate or from the corresponding contact/bonding points continues to be ensured.

The teachings of the present disclosure therefore make it possible to integrate a hot element into a plastic functional housing. Some embodiments of the sensor element have a high resistance to media and a particularly good temperature resistance. This is ensured by the plastic functional housing and also the hot plate, which in particular consists of ceramic, with corresponding carrier substrate. The low thermal expansion of the plastic material of the functional housing means that a direct encapsulation of electronic components is possible. The thermal conductivity of the plastic can be adjusted. Other possible advantages are downsets of components (e.g., chip, sensor element), integration of additional technical options (e.g., O-ring seal), and conversion for standard housings.

In some embodiments, the hot plate may comprise, in addition to a measuring surface, a heating device for actively heating the measuring surface. This heating device can be arranged, for example, on the surface of the hot plate which lies opposite the measuring surface. Using the heating device provided means that a "hot" measuring element is made available, which due to the thermal decoupling provided, can be combined with the functional housing designed as a plastic molded housing.

In some embodiments, the carrier substrate together with the hot plate protrudes from the plastic molded housing. This case preferably involves a so-called long substrate, which is only partially accommodated by the functional housing. The part of the carrier substrate which protrudes from the functional housing in this case carries the hot plate, which is mounted on the carrier substrate in a recess thereof by means of suitable narrow arms.

In some embodiments, the carrier substrate is completely integrated into the plastic molded housing. In these embodiments the plastic molded housing has a cutout, in which the hot plate is arranged so that in this case also, the principle of the thermal decoupling of the hot plate from the surrounding carrier substrate and from the functional housing, in which the carrier substrate is integrated, is ensured. In this embodiment therefore, the plastic molded housing comprises in particular a window that covers both the cutout in the carrier substrate and the hot plate, which is arranged in the cutout.

In some embodiments, the plastic molded housing includes at least one functional part for securing the housing. The plastic molded housing can itself be used for appropriate functional tasks, or be equipped with one or a plurality of functional parts that are provided for such functional tasks. Such functions are, for example, mechanical protection, protection against media, or flow control. Suitable functional parts can be used for securing the housing (screw fixing), or ensure an appropriate plugging geometry, etc.

In some embodiments, the associated evaluation device for the sensor element is integrated into the plastic molded housing.

BRIEF DESCRIPTION OF THE DRAWINGS

The invention is explained in detail below on the basis of exemplary embodiments and in conjunction with the drawing.

These show.

DETAILED DESCRIPTION

Figure 1:
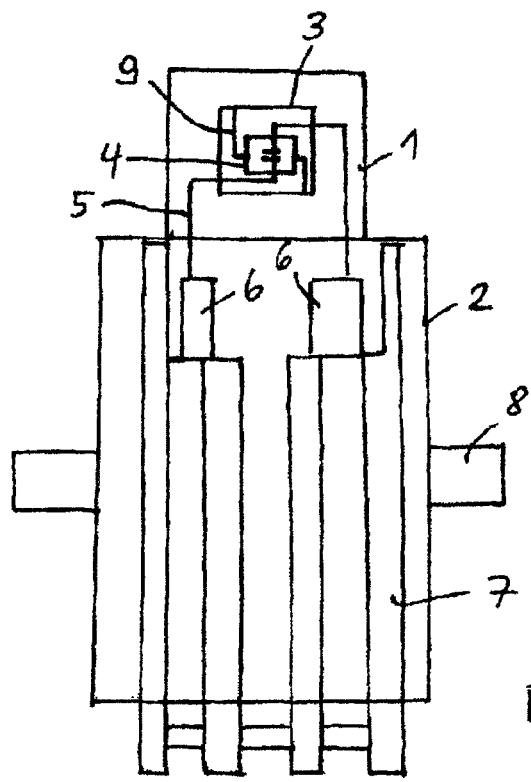
FIG. 1 a schematic plan view of a first embodiment of a sensor element.

In the sensor element shown in FIG. 1, a carrier substrate 1 provided with a hot plate 4 is partially integrated into a functional housing, designed as a plastic molded housing 2, for the sensor element. The carrier substrate 1 therefore projects out of the functional housing 2. It comprises a rectangular cutout 3, in which the actual measuring element, namely the hot plate 4, is mounted on the carrier substrate 1 by means of four narrow arms 9. Corresponding contacts 5 for a measuring surface, which is located on the top side of the hot plate 4, extend via two arms to contact points 6 arranged on the carrier substrate 1. Two further contacts that extend via the other two arms 9, lead to a heating device provided on the underside of the hot plate 4.

The plastic molded housing 2 covers a part of the contacts 5 and the contact points 6 on the carrier substrate 1. It further comprises a corresponding wiring, of which conductor tracks 7 are shown that are connected to the contact points 6. The plastic molded housing 2 is formed directly on the carrier substrate 1 and encloses it in a sealed manner. It additionally carries a corresponding functional part 8, which can be designed, for example, as a screw-in aid.

Figure 2:
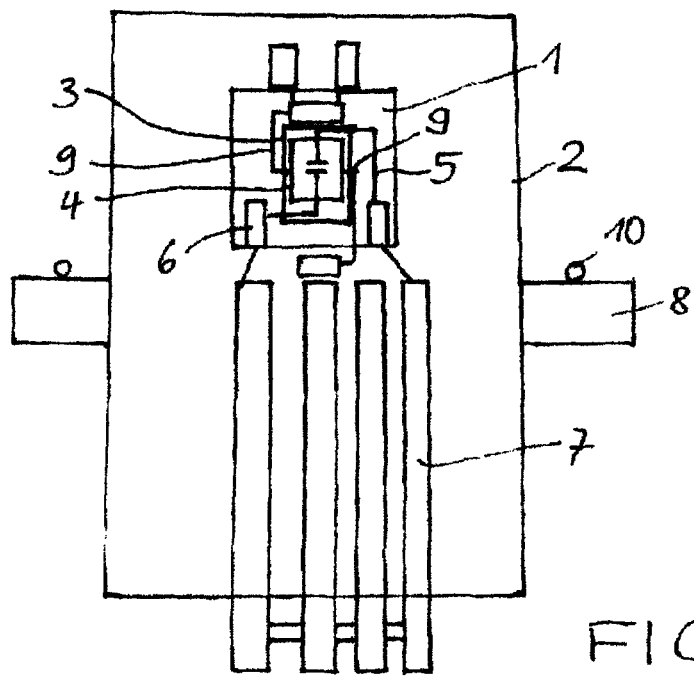
FIG. 2 a schematic plan view of a second embodiment of a sensor element.

In the embodiment shown in FIG. 2, the carrier substrate 1 of the hot plate 4 is fully integrated into the plastic molded housing 2 which serves as the functional housing. In this embodiment the carrier housing 1 also comprises an approximately rectangular cutout 3, within which a hot plate 4 is mounted on corresponding carrier arms 9 which lead to the carrier substrate. On the arms 9 are located contacts 5, which lead to corresponding contact/bonding points 6. From the contact/bonding points 6 extend conductor tracks 7, which form part of a corresponding wiring.

Also in FIG. 2, the plastic molded housing 2 has a functional part 8, designed as a screw-in aid, which in this embodiment carries an O-ring 10.

Whereas FIG. 1 illustrates a so-called long substrate used as the carrier substrate, FIG. 2 shows an approximately square carrier substrate 1. In FIG. 2, a suitable window is provided in the plastic molded housing 2 for the cutout 3 in which the hot plate 4 is located.

What is claimed is:

1. A sensor element comprising:
   a measuring element including
   a hot plate connected to a carrier substrate by means of narrow arms in a broadly thermally decoupled manner,
   a plastic molded housing enclosing at least a portion of the carrier substrate but leaving the hot plate and the narrow arms exposed,
   two of the narrow arms include electrical contacts between the hot plate and electrical contacts disposed on the carrier substrate,
   a portion of the carrier substrate together with the contact/bonding points is enclosed by the plastic molded housing, and
   said housing includes connection wiring for the contact/bonding points.

2. The sensor element as claimed in claim 1, wherein the measuring element comprises, in addition to a measuring surface, a heating device for actively heating the measuring surface.

3. The sensor element as claimed in claim 1, wherein the carrier substrate and the hot plate protrude from the plastic molded housing.

4. The sensor element as claimed in claim 1, wherein the plastic molded housing comprises a cutout in which the hot plate is arranged.

5. The sensor element as claimed in claim 1, wherein the plastic molded housing includes at least one functional part for securing the housing.

6. The sensor element as claimed in claim 1, wherein the associated evaluation device for the sensor element is integrated into the plastic molded housing.

7. A method for housing a sensor element, the method comprising:
   mounting a carrier substrate in a plastic molded housing;
   the carrier substrate including a hot plate connected to the carrier substrate in a thermally decoupled manner using narrow arms;
   wherein the plastic molded housing at least partially surrounds the measuring element and leaves the hot plate and the narrow arms exposed;
   the plastic molded housing including connection wiring for the measuring element; and
   connecting the connection wiring of the housing to the measuring element using two of the narrow arms between the carrier substrate and the hot plate,
   wherein the carrier substrate together with the contact/bonding points is at least partially integrated into the plastic molded housing.

* * * * *